United States Patent [19]

Matsui et al.

[11] Patent Number: 4,689,568
[45] Date of Patent: Aug. 25, 1987

[54] NMR CHEMICAL SHIFT IMAGING METHOD

[75] Inventors: Shigeru Matsui, Koganei; Kensuke Sekihara, Hachioji; Hideki Kohno, Tokyo; Takashi Onodera, Kokubunji; Hidemi Shiono, Akikawa, all of Japan

[73] Assignee: Hitachi, Ltd., Tokyo, Japan

[21] Appl. No.: 750,475

[22] Filed: Jul. 1, 1985

[30] Foreign Application Priority Data

Mar. 11, 1985 [JP] Japan .................................. 60-46552

[51] Int. Cl.$^4$ ............................................ G01R 33/20
[52] U.S. Cl. ..................................... 324/309; 324/312
[58] Field of Search ............... 324/309, 307, 312, 311, 324/300

[56] References Cited

U.S. PATENT DOCUMENTS

| | | | |
|---|---|---|---|
| 4,355,282 | 10/1982 | Young et al. | 324/309 |
| 4,361,807 | 11/1982 | Burl et al. | 324/309 |
| 4,451,788 | 5/1984 | Edelstein et al. | 324/309 |
| 4,509,015 | 4/1985 | Ordidge et al. | 324/309 |
| 4,527,124 | 7/1985 | Van Uijen | 324/309 |
| 4,581,582 | 4/1986 | Redington | 324/309 |
| 4,588,948 | 5/1986 | Mansfield | 324/309 |
| 4,595,879 | 6/1986 | Lent et al. | 324/309 |
| 4,646,023 | 2/1987 | Young | 324/309 |

FOREIGN PATENT DOCUMENTS

| | | | |
|---|---|---|---|
| 0127480 | 12/1984 | European Pat. Off. | 324/309 |
| WO85/05693 | 12/1985 | PCT Int'l Appl. | 324/307 |
| 2125563 | 3/1984 | United Kingdom | 324/309 |

OTHER PUBLICATIONS

King, et al., "A Unified Description of NMR Imaging, Data-Collection Strategies and Reconstruction", Med. Phys. 11(1), Jan./Feb. 1984.

Maudsley et al., 'Spatially Resolved High Resolution Spectroscopy by "Four Dimensional" NMR', Jour. of Mag. Res. 51, pp. 147-152, 1983.

Tropper, M. M., Image Reconstruction for the NMR Echo-Planar Technique, and for a Proposed Adaptation to Allow Continuous Data Acquisition, J. of Mag. Res. 42, pp. 193-202, 1981.

Primary Examiner—Stewart J. Levy
Assistant Examiner—Scott M. Oldham
Attorney, Agent, or Firm—Antonelli, Terry & Wands

[57] ABSTRACT

An NMR imaging method which provides a three-dimensional image representative of the two-dimensional distribution of nuclear spin species resolved by chemical shift or the local spectra resolved by two-dimensional location. After the excitation of nuclear spins and the phase-encoding by application of a field gradient $G_y$, a periodically inverting field gradient $G_x$ is generated to yield a continuous echo train. The echo train is sampled and separated into data of odd-numbered echoes and data of even-numbered echoes which data are in turn reconstructed into two-dimensional data arrays, respectively. The data thus reconstructed are three-dimensional Fourier-transformed.

9 Claims, 7 Drawing Figures

4,689,568

NMR CHEMICAL SHIFT IMAGING METHOD

BACKGROUND OF THE INVENTION

The present invention relates to a method for measuring living tissues non-invasively by using nuclear magnetic resonance (NMR), and in particular to a method for measuring the chemical-shift-resolved spatial distribution of a predetermined nuclear species within the living tissues at high speed.

A slight shift (chemical shift) is produced in the nuclear magnetic resonance frequency of one nuclear species depending upon the chemical bond state in which the species is embraced. In the field of NMR imaging, imaging of the density destribution of protons ($^1$H) has mainly been conducted so far. In recent years, an imaging method in which the chemical shift information can be distinguished by combining spectroscopic techniques has been developed. Since several kinds of phosphorus compounds play an important role in the metabolic process, it is expected that the chemical shift imaging of phosphorus 31 ($^{31}$P) would significantly contribute to the biochemical diagnosis of living tissues.

A chemical shift imaging method using multidimensional Fourier imaging has been proposed by A. A. Maudsley et al "Spatially Resolved High Resolution Spectroscopy by Four-Dimensional NMR", Journal of Magnetic Resonance, Vol. 51, 1983, p.p. 147 to 152. When imaging of an x-y plane having picture elements as many as ($N_x \cdot N_y$) is to be conducted by this method, it is necessary to conduct $N_x$ and $N_y$ phase encoding operations along the x and y axes, respectively and measure spectroscopic free induction decay (FID) signals. As a result, the imaging method needs a measurement time which is approximately hundred times that of the conventional NMR imaging since $N_x$ and $N_y$ are of the order of 100.

U.S Pat. No. 4,361,807 has disclosed a method, where a periodically inverting field gradient is superimposed on a static magnetic field to produce an echo train containing both positional dispersion information and chemical shift dispersion information and the measured echo train is Fourier-transformed. Concurrently with the direction inversion of the magnetic field gradient, a signal representing the nuclear spin information at a location on the spatial coordinate axis moves between two different positions on the frequency axis. If the measured signal is directly Fourier-transformed, therefore, a trouble is incurred in the analysis of the spatial information.

SUMMARY OF THE INVENTION

An object of the present invention is to provide a chemical shift imaging method in which high speed measurements can be easily performed.

Another object of the present invention is to provide a chemical shift imaging method in which the bandwidth of the chemical shift axis can be expanded without lowering the spatial resolution and without increasing the total measurement time any further.

In accordance with one feature of the present invention, sampled data of an echo train obtained during inverting a magnetic field gradient with a predetermined repetition period are divided into data of even-numbered echoes and data of odd-numbered echoes. The resultant even-numbered echo data and/or odd-numbered echo data are rearranged in accordance with the echo number order and the sampling number order to provide a two-dimensional data set which is subjected to multi-dimensional Fourier transformation with the echo number and the sampling number taken as two distinct variables.

In accordance with another feature of the present invention, the even-numbered echo data and the odd-numbered echo data are respectively rearranged in accordance with the echo number order and the sampling number order to provide first and second two-dimensional data arrays. Each of the rearranged two-dimensional data arrays is subjected to multi-dimensional Fourier transformation with the echo number and the sampling number taken as two distinct variables. The data resulting from the Fourier transformation of the first two-dimensional data array are provided with spatial coordinates having signs opposite to these of the data resulting from the Fourier transformation of the second two-dimensional data array. Both data are added together after correcting the sign differences in the spatial coordinates.

In accordance with still another feature of the present invention, prior to the sampling of the echo train, a second magnetic field gradient is generated for a predetermined period along at least one direction (second direction) in a plane which is perpendicular to the direction (first direction) of the above-described inverting field gradient or first gradient, the spatial information of the second direction being encoded into the phase of the echo train signal. The sequence including the above-described sampling and data rearrangement is repeated a plurality of times while changing the amplitude and/or generation time period of the second field gradient. The resultant three-dimensional data arrays are subjected to multi-dimensional Fourier transformation with the echo number, the sampling number, and the sequence repetition number taken as three distinct variables. As a result, the two-dimensional distribution of the nuclear spin species distinguished by the chemical shifts or the local spectra distinguished by the two-dimensional location are rapidly obtained.

In accordance with still another feature of the present invention, the first gradient field is generated with such inversions that the duration of the field in its positive sense is different from the duration thereof in its negative sense and a product of the strength and duration of the field in the positive sense is equal to that in negative sense.

DESCRIPTION OF THE PREFERRED EMBODIMENTS

Figure 1:
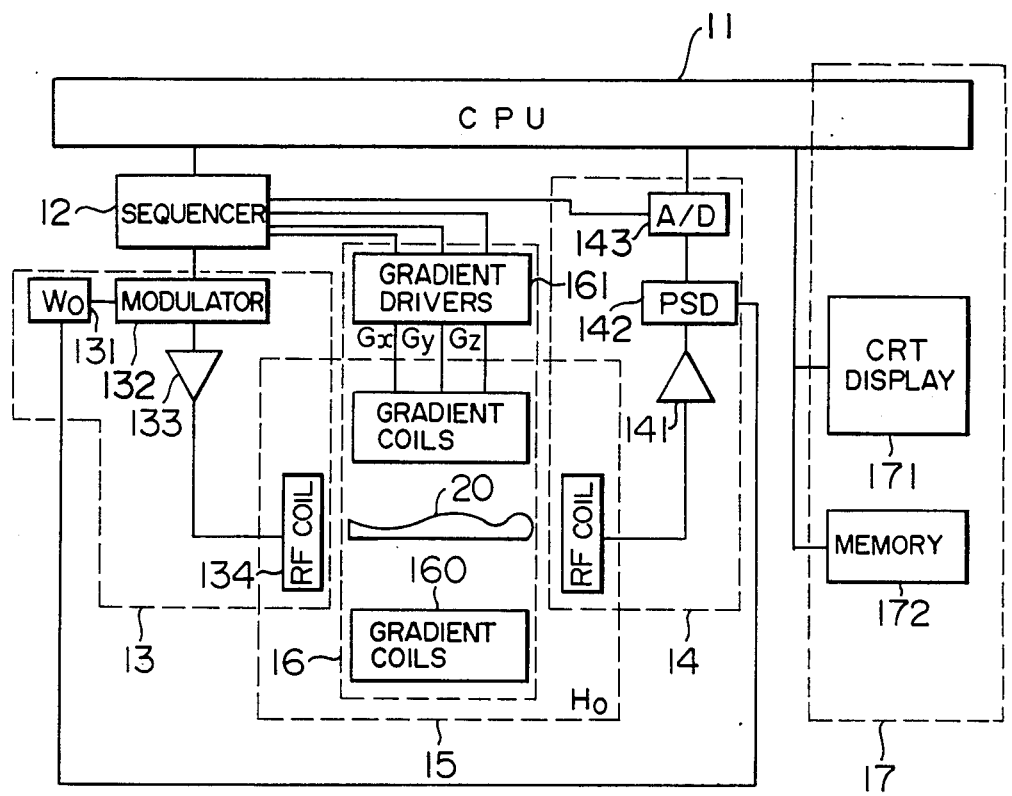
FIG. 1 is a block diagram of an apparatus embodying the present invention.

The construction and operation of an embodiment of the present invention will now be described. FIG. 1 is a block diagram of an apparatus embodying the present invention. The apparatus includes a sequencer 12 controlled by a CPU 11, a transmitter system 13, a receiver system 14, a field gradient generating system 16, a signal processor system 17, and a magnet 15 for generating a uniform static magnetic field $H_o$. The sequencer 12 sends various instructions or commands required for the present invention toward units. The transmitter system 13 includes an RF synthesizer 131, a modulator 132, and an RF amplifier 133 so that RF pulses amplitude-modulated in accordance with a command are supplied to an RF coil 134 to apply an RF magnetic field $H_1$ to an object 20. The field gradient generating system 16 includes gradient coils 160 wound for producing field gradients along three directions x, y and z, respectively and drivers 161 for driving the respective coils. In accordance with commands from the sequencer 12, the field gradient generating system 16 superimposes gradients $G_x$, $G_y$ and $G_z$ along x, y and z directions, respectively, on the above-described uniform static magnetic field $H_o$. NMR signal responses to all these applied magnetic fields are received by the receiver system 14 through the aforementioned RF coil 134. The receiver system 14 includes an RF amplifier 141, a phase sensitive detector 142, and an A/D converter 143. Data sampled at timings specified by a command from the sequencer 12 are sent from the receiver system 14 to the signal processor system 17. The signal processor system 17 performs processing for imaging such as data rearrangement and Fourier transformation. The resultant video data are displayed on a CRT display 171.

Figure 2:
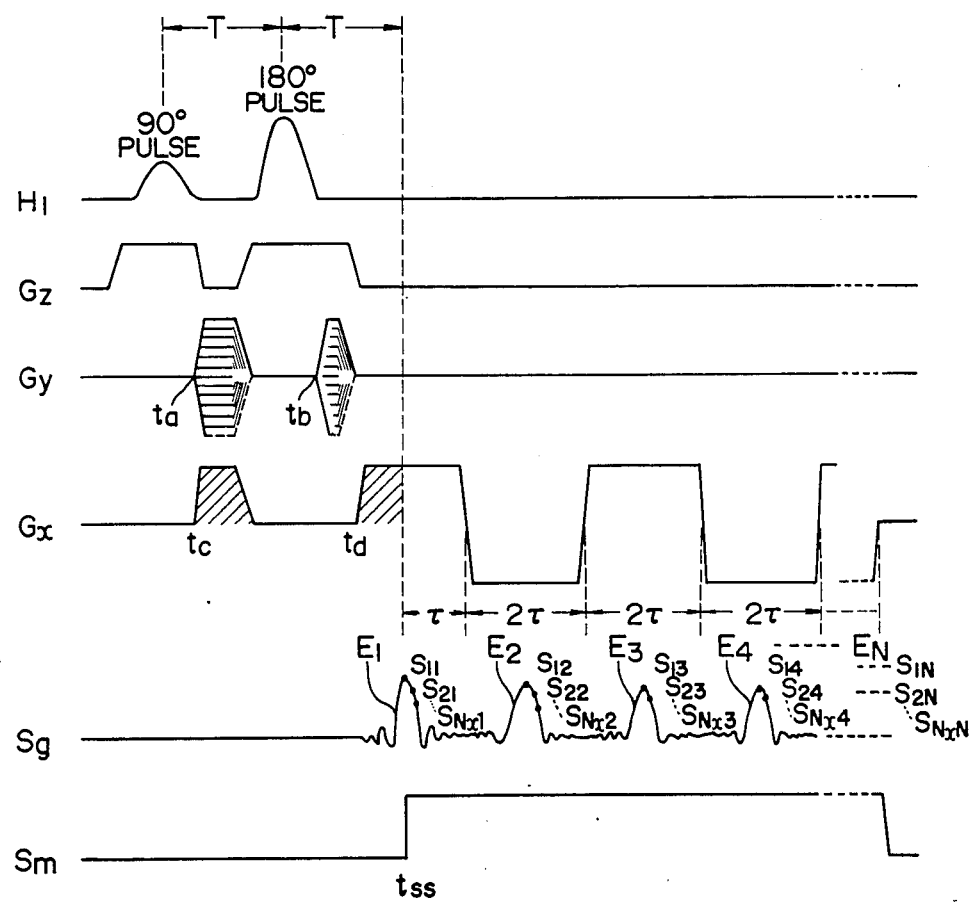
FIG. 2 is a time sequence diagram of an embodiment of a method according to the present invention.

FIG. 2 shows the pulse sequence of an embodiment for realizing chemical shift imaging for a particular x-y plane in an object. $H_1$ represents RF pulses (only one side of the envelope is illustrated). $G_x$, $G_y$, and $G_z$ represent field gradients in the x, y and z directions, respectively. $S_m$ represents a signal sampling period. $S_g$ represents signals containing chemical shift and spatial information which appear during the sampling period. At first, the gradient field $G_z$ of the z direction is generated and a narrow-band 90° RF pulse is applied to the object to selectively excite nuclear spins in a particular slice of the object.

When a time T has elapsed after the application of the 90° RF pulse, the field gradient $G_z$ in the z direction is again applied and at the same time a 180° RF pulse is applied to invert the senses or directions of the above-described nuclear spins. If any effect of phase encoding which will be described below is neglected, a spin echo will have its peak at a time instant $t_{ss}$ when the time T has elapsed again after the application of the 180° RF pulse. At time instants $t_a$ and $t_b$, field gradients $G_y$ having a predetermined amplitude are generated in the y direction to encode y spatial information into the phase of the echo train signal. The amplitude is changed $N_y$ times for each repetition of the sequence illustrated in FIG. 2, the amplitude being increased by $2|G_y|/N_y$. In the example of FIG. 2, the field gradient $G_y$ is generated twice, i.e., at the time instants $t_a$ and $t_b$ to cancel the rising and falling transient portions of $G_y$ in order that linear phase-encodings can be realized simply by changing the amplitude of $G_y$ linearly. Provided that the amplitude is varied with taking the transient portions into consideration, the $G_y$ pulse may be generated once before or after the 180° RF pulse.

From the time instant $t_{ss}$, the signal is sampled. During the sampling period, the field gradient $G_x$ of the x direction is generated. The sense of $G_x$ is inverted when $\tau$ has elapsed after $t_{ss}$. Thereafter, the sense of $G_x$ is inverted at intervals of $2\tau$. The inversion of $G_x$ is made N times in total. Under a uniform static magnetic field, there appears a spin echo at $t_{ss}$ as result of rephasing of the phase dispersion caused by chemical shifts. However, when the periodically inverting field gradient $G_x$ is being generated, an echo train including echoes $E_1$, $E_2$, $E_3$, ..., $E_N$ appears as illustrated in FIG. 2. Fixing our eyes upon each echo, the echo signal contains x spatial information. If the echo train is sampled at intervals of $4\tau$, only chemical shift information is obtained.

In the illustrated embodiment, the field gradient $G_x$ rises at not the time instant $t_{ss}$ but a time instant $t_d$ preceding $t_{ss}$. That reason is because the initial half of the first echo is needed when whole echoes are used for improving spatial resolution.

In order to cancel the effect of $G_x$ during the second period T, $G_x$ is generated for a short time starting from a time instant $t_c$ which precedes the application of the 180° RF pulse. The method for generating such a field gradient is described in U.S. patent application Ser. No. 635,154 filed July 27, 1984, entitled "NMR Imaging Method and Apparatus" by E. YAMAMOTO et al now U.S. Pat. No. 4,625,170, issued Nov. 25, 1986, the disclosure of which is incorporated herein by reference.

The sampled data for each echo is processed by the signal processor system 17 illustrated in FIG. 1. In the example illustrated in FIG. 2, only the latter half of each echo signal is sampled. The former half of each echo relates to its latter half as an Hermite conjugate. Sampling both the former half and latter half will result in improvement of spatial resolution.

Figure 3:
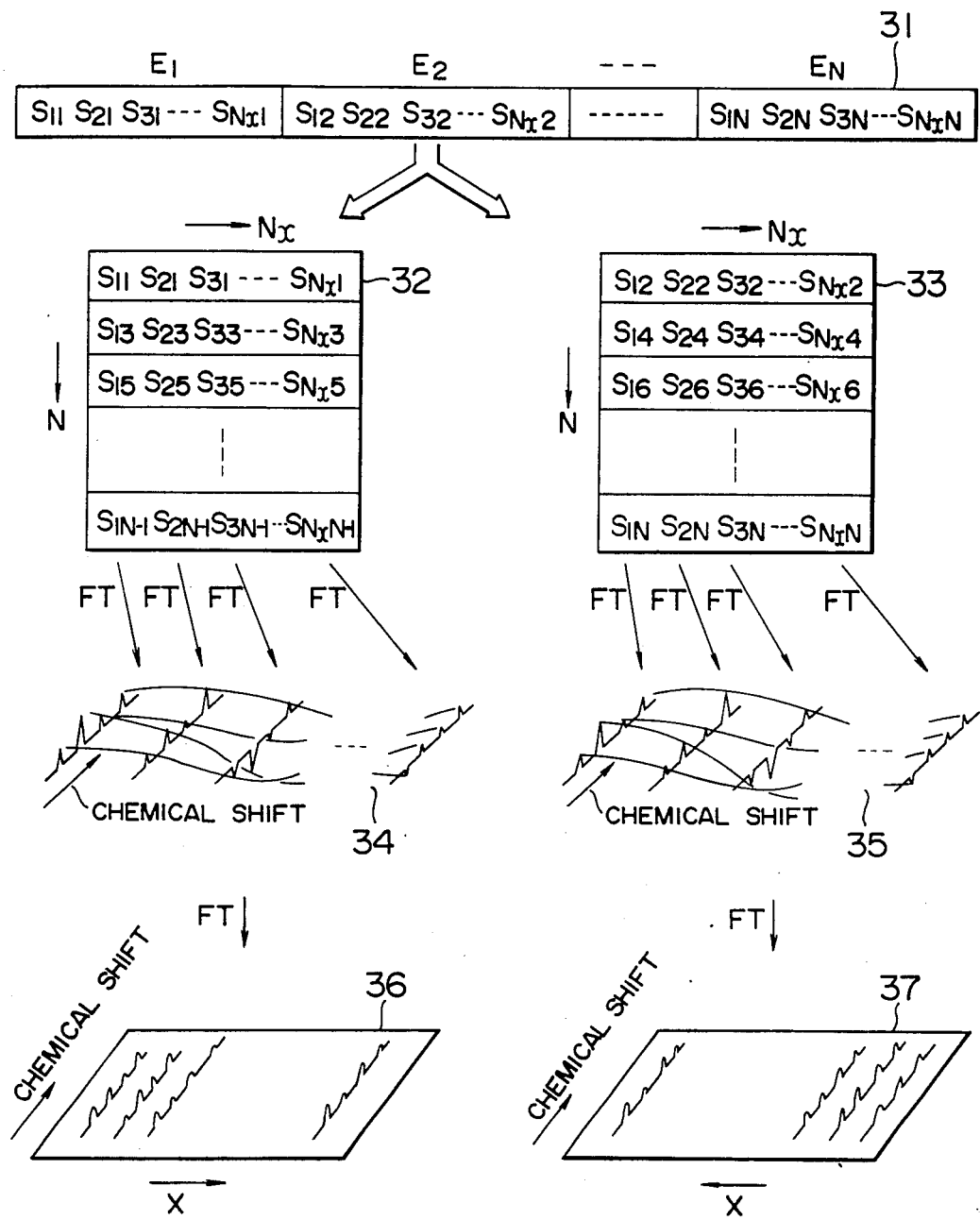
FIG. 3 is a flow diagram for illustrating the data processing in the embodiment of the present invention.

The procedure for data processing will now be described by referring to FIG. 3. A stream 31 of data $S_{11}$, $S_{21}$, ..., $S_{Nx1}$ (for the first echo $E_1$), $S_{12}$ $S_{22}$, ..., $S_{Nx2}$ (for the second echo $E_2$), ..., $S_{1N}$, $S_{2N}$, ..., $S_{NxN}$ (for the N-th echo $E_N$) as shown in FIG. 3 are successively obtained by sampling and are stored in a first area of a memory 172 of the signal processor system 17. First suffixes 1 to $N_x$ attached to "S" represent the sampling number for each echo and second suffixes 1 to N represent the echo number. Then, the data stream 31 is divided into data of odd-numbered echoes $E_1$, $E_3$, ..., $E_{N-1}$ and data of even-numbered echoes $E_2$, $E_4$, ..., $E_N$ and the odd-numbered echo data and the even-numbered echo data are rearranged in second and third areas of the memory 172 in accordance with the echo number and the sampling number to provide respective two-dimensional data arrays 32 and 33. Each of the two-dimensional data arrays 32 and 33 thus obtained is Fourier-transformed with the echo number N taken as a variable. The Fourier transformation of the data array 32 or 33 with respect to N gives chemical shift information 34 or 35. Another Fourier transformation of the data 34 or 35 with the sampling number $N_x$ taken as a second variable yields two-dimensional data 36 or 37 having the chemical shift and the X coordinate as two axes. Since the even-numbered echoes are echoes obtained for the field gradient $G_x$ of the negative sense, however, the two-dimensional data 37 must be provided with X coordinates having signs opposite to the two-dimensional data array 36. Chemical shift imaging can be realized using either one of the two two-dimensional data 36 and 37. Addition of the two two-dimensional data 36 and 37 results in the imaging with a higher S/N ratio.

Figure 4:
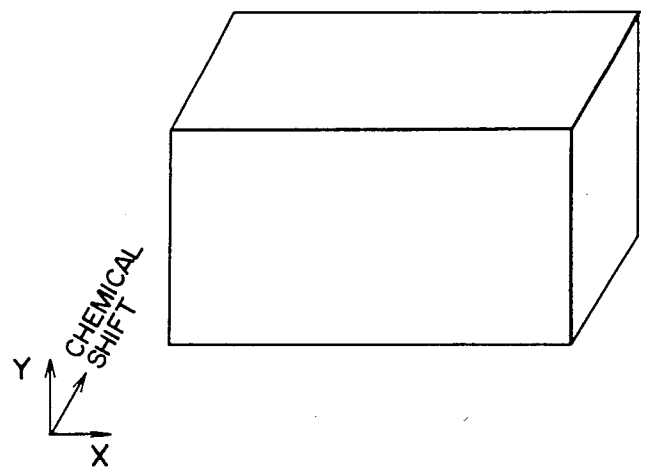
FIG. 4 is a conceptual diagram illustrating three-dimensional data obtained in the embodiment of the present invention.

In the embodiment illustrated in FIG. 2, the two-dimensional data arrays 32 and 33 of FIG. 3, which have been phase-modulated in $N_y$ ways by the field gradient $G_y$ along the y direction, are obtained. If one of the data 36 and 37 or the data obtained by adding the data 36 and 37 is Fourier-transformed with $N_y$ taken as a third variable, it is possible to finally obtain three-dimensional information having X, Y and chemical shift axes as three distinct axes, as illustrated in FIG. 4. That is to say, in the embodiment of FIG. 2, data rearrangement illustrated in FIG. 3 is carried out for every $N_y$ times repetition of the sequence of FIG. 2 to provide a three-dimensional data array which are in turn stored in the second or third area of the memory 172 of the signal processor system 17, as has been described above. The three-dimensional data array is three-dimensional Fourier-transformed with N, $N_x$ and $N_y$ taken as three distinct variables, thereby providing such a three dimensional data array as shown in FIG. 4 which are in turn stored in a fourth area of the memory 172. The stored data provide two-dimensional images resolved by the chemical shifts or the local spectra resolved by positions within the two-dimensional plane. As compared with the conventional chemical shift imaging, therefore, the measurement dimensions can be reduced by one, resulting in high speed imaging.

Figure 5:
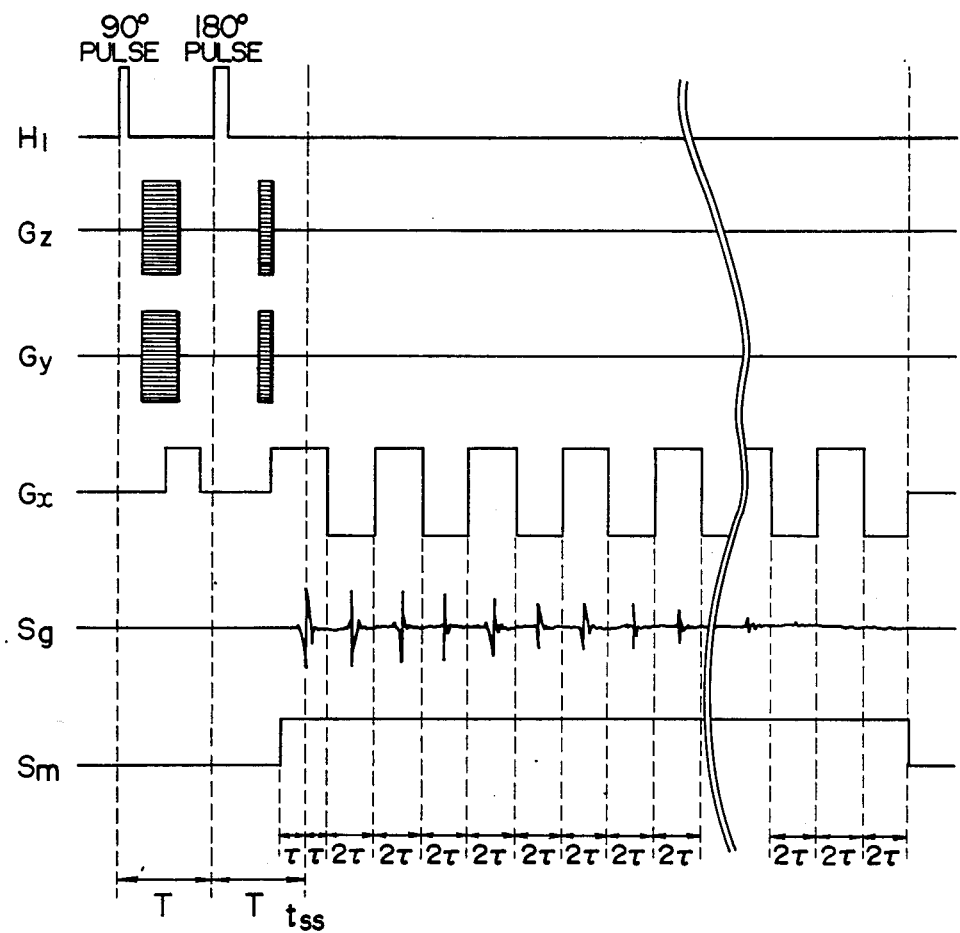

An example of chemical-shift resolved three-dimensional imaging of the object will now be described by referring to FIG. 5. At first, the 90° RF pulse is applied to the object to excite the nuclear spins within the object. When a time T has elapsed after the application of the 90° RF pulse, the 180° RF pulse is applied to the object. These RF pulses are wideband RF pulses unlike those used in the sequence illustrated in FIG. 2. The pulse $G_x$ is so generated as to be inverted with a period of $4\tau$ in the same way as in FIG. 2. At $t_a$ and $t_b$ preceding the appearance of the first spin echo, the field gradients $G_y$ and $G_z$ are generated for the purpose of phase-encoding in the y and z directions. For the applications of $G_z$ and $G_y$, the amplitudes are varied $N_y$ and $N_Z$ times, respectively. Therefore, measurements using the sequence of FIG. 5 are repeated $N_z \times N_y$ times in total.

The rearrangement of the sampling data and its Fourier transformation with N taken as a variable are carried out in the same way as the description given with reference to FIG. 3. Further Fourier transformation of the resultant data with $N_x$, $N_y$ and $N_z$ taken as other variables yields chemical-shift-resolved three-dimensional distribution of a nuclear spin species within the object.

Figure 6:
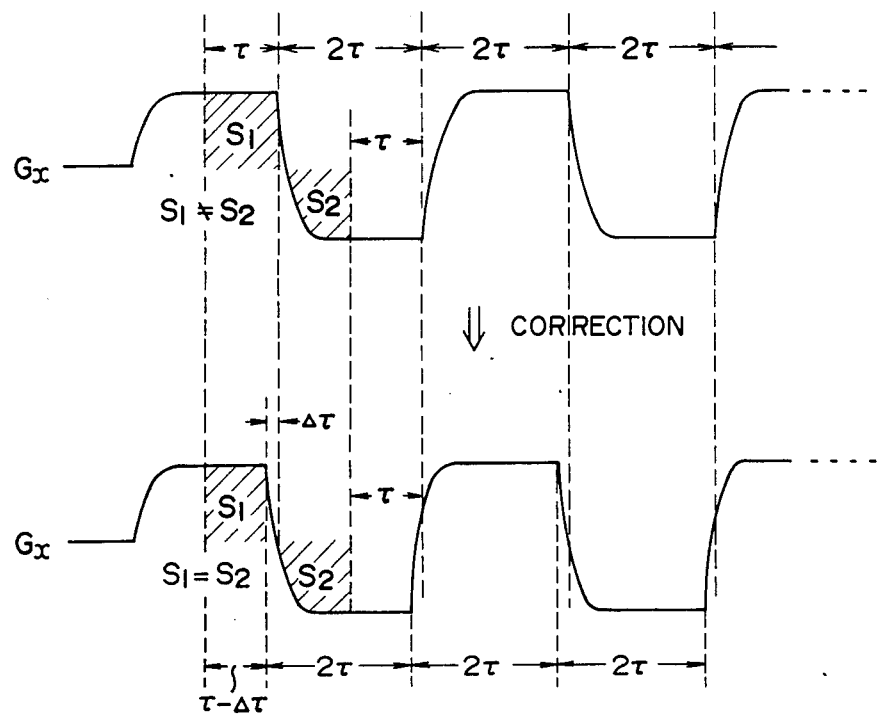
FIGS. 5 to 7 are time sequence diagrams for illustrating other embodiments of the present invention.

In all of the above-described embodiments, it was assumed that the time required for the inversion of the field gradient is very short as compared with the time $\tau$. In some actual cases, however, the inversion time cannot be completely neglected as compared with $\tau$. In such cases, an area relation $S_1 \neq S_2$ is incurred as illustrated in FIG. 6. Accordingly, the field gradient application effect cannot be successfully cancelled as required in this method. Thus, the timing of each of echoes occurring continuously is significantly disturbed. As a result, the data processing as illustrated in FIG. 3 loses its effectiveness. This problem can be simply and effectively avoided by providing the timings of the field gradient inversions with an offset $\Delta \tau$ as illustrated in FIG. 6 to satisfy the area condition of $S_1 = S_2$.

In case the time required for inverting the field gradient is in the order of $\tau$, it is effective to use a field gradient varying in accordance with a cosine waveform instead of the rectangular shaped inversion used in the above-described embodiment. In case a field gradient $G_x$ having such a shape other than the rectangular wave is used, the sampled signal must be multiplied, prior to the next data processing, by corresponding coefficients determined by the waveform of $G_x$. This technique is described by M. M. Tropper "Image Reconstruction for the NMR Echo-Planar Technique, and for a Proposed Adaptation to Allow Continuous Data Acquisition", Journal of Magnetic Resonance, Vol. 42, 1981, pp. 193–202.

Figure 7:
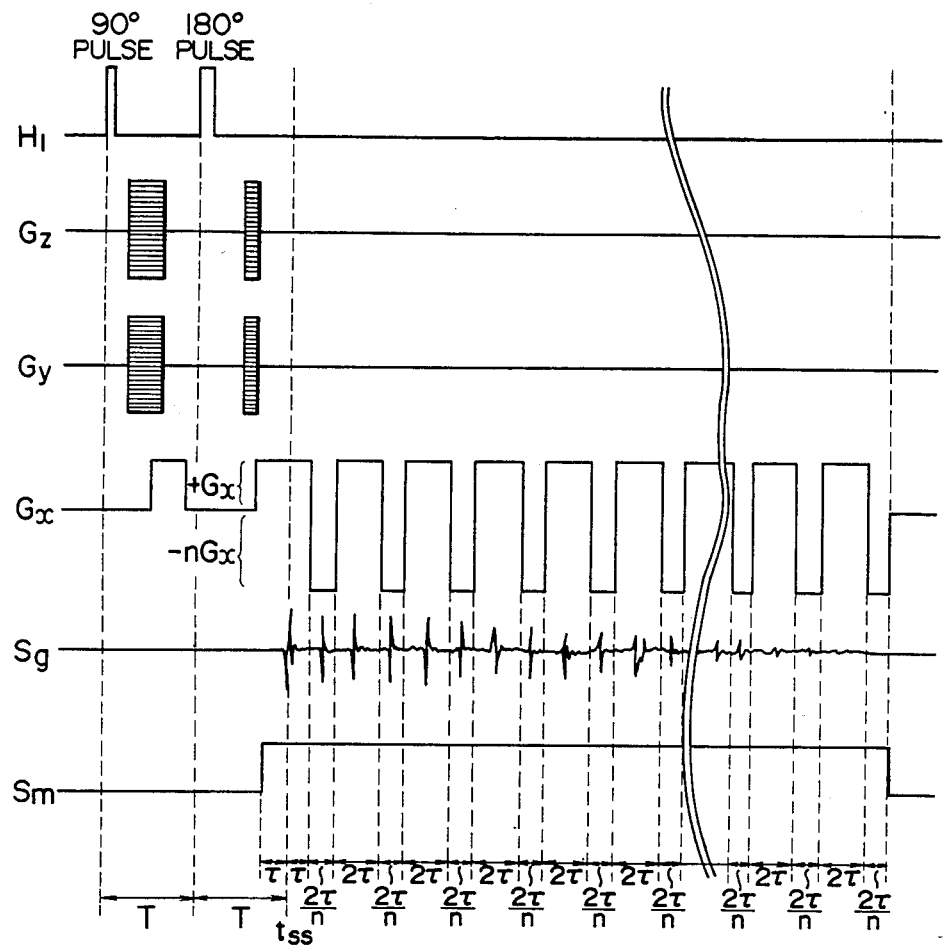

In the embodiment of FIG. 2 or the embodiment of FIG. 5, the minimum time unit of the N axis illustrated in FIG. 3 is $4\tau$, which is the inversion period of the field gradient. Accordingly, the bandwidth of the chemical shift axis corresponding to the Fourier transformation of the N axis becomes $1/(4\tau)$. This bandwidth must be set especially wide if the magnetic field strength is high or the nuclear species such as $^{31}P$ having wide chemical shift distribution is used. The expansion of the bandwidth is attained by an embodiment illustrated in FIG. 7. In the inverting field gradient $G_x$, the negative strength is set n times as large as the positive strength. In addition, the duration of the negative pulse is made $1/n$ times the duration of the positive pulse to make the strength-duration product of $G_x$ of the positive sense equal to the strength-duration product of $G_x$ of the negative sense. That is to say, $G_x$ is continuously inverted at intervals of $2\tau$ and $2\tau/n$. For the echo train signal thus obtained, even-numbered echoes and odd-numbered echoes are individually rearranged in the same way as in FIG. 3. The minimum time unit of the N axis becomes $2(n+1)\tau/n$, which is the repetition period of the field gradient inversion. The minimum time unit can be reduced to $2\tau$ by making n larger. As a result, it becomes possible to expand the bandwidth of the chemical shift axis up to approximately twice as compared with the prior art without sacrificing the spatial resolution of the image and without increasing the total measurement time.

We claim:

1. A method for performing chemical shift imaging for a specified nuclear species included in an object which is placed in a uniform static magnetic field, comprising:

a step (a) of exciting nuclear spins included in a predetermined area of said object;

a step (b) of inverting the sense of said nuclear spins to obtain a spin echo of said nuclear spins;

a step (c) of generating a periodically inverting first field gradient along a first direction within said static magnetic field, thereby converting said spin echo into an echo train;

a step (d) of measuring the wave shape of said echo train by means of phase sensitive detection and sampling the measured echo train signal while only said first field gradient is generated to provide discrete data;

a step (e) of generating in addition to said static magnetic field a second field gradient along a second direction different from said first direction during a predetermined duration preceding the beginning of said measurement step (d), thereby encoding spatial information relating to said second direction into the phase of said nuclear spins;

a step (f) of dividing said discrete data into data of odd-numbered echoes in said echo train and data of even-numbered echoes in said echo train, and rearranging said discrete data of the odd-numbered echo data and/or the even-numbered echo data in accordance with the echo number order and the sampling number order to provide a two-dimensional data array;

a step (g) of repeating said steps (a) to (f) a plurality of times while changing the amplitude and/or duration of said second field gradient, thereby obtaining at least one three-dimensional data array; and a step (h) of multi-dimensional Fourier-transforming said three-dimensional data with the echo number, sampling number, and sequence repetition number taken as three distinct variables, thereby obtaining spectroscopically resolved multi-dimensional distribution of the nuclear species or local spectra resolved by multi-dimensional location.

2. A method according to claim 1, wherein said step (e) further includes generating in addition to said static magnetic field a third gradient along a third direction different from said first and second directions during said predetermined duration, thereby encoding spatial information relating to said third direction into the phase of said nuclear spins;

and wherein said step (g) further includes repeating said steps (a) to (f) a plurality of times while changing the amplitude and/or duration of said third field gradient, thereby obtaining at least one fourth dimensional data array.

3. A method according to claim 1, wherein the rearrangement in said step (f) provides a first two-dimensional data array for said odd-numbered echo data and a second two-dimensional data array for said even-numbered echo data.

4. A method according to claim 3, further comprising:
a step of providing the nuclear spin information obtained from said first two-dimensional data array with spatial coordinates having signs opposite to those of spatial coordinates of the nuclear spin information obtained from said second two-dimensional data array; and
a step of adding the resultant nuclear spin information of said first and second two-dimensional data arrays on said spatial coordinates.

5. A method according to claim 1, wherein said first field gradient generated in said step (c) is inverted so that the duration of the field in its positive sense is differernt from that thereof in its negative sense and a product of the strength and duration of the field in its positive sense is equal to that thereof in its negative sense.

6. A method for performing chemical shift imaging for a specified nuclear species included in an object which is placed in a uniform static magnetic field, comprising:
a step (a) of selectively exciting nuclear spins included in a specified slice of said object;
a step (b) of inverting the sense of said nuclear spins to obtain a spin echo of said nuclear spins;
a step (c) of generating a periodically inverting first field gradient along a first direction in a plane of said slice within said static magnetic field, thereby converting said spin echo into an echo train;

a step (d) of measuring the wave shape of said echo train by means of phase sensitive detection and sampling the measured echo train signal while only said first field gradient is generated to provide discrete data;

a step (e) of generating in addition to said static magnetic field a second field gradient along a second direction which is in said plane and is perpendicular to said first direction during a predetermined duration preceding the beginning of said measurement step (d), thereby encoding spatial information relating to said second direction into the phase of said nuclear spins;

a step (f) of dividing said discrete data into data of odd-numbered echoes in said echo train and data of even-numbered echoes in said echo train and rearranging said discrete data of said odd-numbered echo data and/or the even-numbered echo data in accordance with the echo number order and the sampling number order to provide a two-dimensional data array;

a step (g) of repeating said steps (a) to (f) a plurality of times while changing the amplitude and/or duration of said second field gradient, thereby obtaining at least one three-dimensional data array; and a step (h) of multi-dimensional Fourier-transforming said three-dimensional data with the echo number, sampling number, and sequence repetition number taken as three distinct variables, thereby obtaining spectroscopically resolved two-dimensional distribution of the nuclear species or local spectra resolved by two-dimensional location.

7. A method according to claim 6, wherein the rearrangement in said step (f) provides a first two-dimensional data array for said odd-numbered echo data and a second two-dimensional data array for said even-numbered echo data.

8. A method according to claim 7, further comprising:
a step of providing the nuclear spin information obtained from said first two-dimensional data array with spatial coordinates with respect to said first direction having signs opposite to those of spatial coordiantes of the nuclear spin information obtained from said second two-dimensional data array; and
a step of adding the resultant nuclear spin information of said first and second two-dimensional data arrays.

9. A method according to claim 6, wherein said first field gradient generated in said step (c) is inverted so that the duration of the field in its positive sense is different from that thereof in its negative sense and a product of the strength and duration of the field in its positive sense is equal to that thereof in its negative sense.

* * * * *